United States Patent [19]
Betz et al.

[11] Patent Number: 5,656,141
[45] Date of Patent: Aug. 12, 1997

[54] APPARATUS FOR COATING SUBSTRATES

[75] Inventors: Hans-Georg Betz, Bruchkoebel, Germany; Gregor A. Campbell, Glendale; Robert W. Conn, Los Angeles, both of Calif.; Karl Matl, Kleinostheim, Germany; Peter Sommerkamp, Hanau, Germany; Alfons Zoeller, Bad Soden-Salmuenster, Germany; Dan M. Goebel, Tarzana, Calif.

[73] Assignee: Leybold Aktiengesellschaft, Hanau, Germany

[21] Appl. No.: 607,273

[22] Filed: Feb. 20, 1996

Related U.S. Application Data

[63] Continuation of Ser. No. 648,118, Jan. 31, 1991, abandoned.

[30] Foreign Application Priority Data

Jun. 25, 1990 [DE] Germany .......................... 40 20 158.9
Aug. 21, 1990 [DE] Germany .......................... 40 26 367.3

[51] Int. Cl.[6] .................................................. C23C 16/50
[52] U.S. Cl. .................. 204/298.05; 204/298.06; 118/723 EB; 118/723 FE; 118/723 HC
[58] Field of Search .......................... 118/723, 726, 118/727, 723 EB, 723 FE, 723 HC; 204/192.12, 298.04, 298.05, 298.06

[56] References Cited

U.S. PATENT DOCUMENTS

| | | | |
|---|---|---|---|
| 3,437,734 | 4/1969 | Roman et al. | 204/298.05 X |
| 4,863,581 | 9/1989 | Inokuti et al. | 204/298.05 |
| 4,868,003 | 9/1989 | Temple et al. | 118/723 X |
| 4,885,070 | 12/1989 | Campbell et al. | 204/298.05 X |
| 4,941,430 | 7/1990 | Watanabe et al. | 204/298.05 X |

FOREIGN PATENT DOCUMENTS

| | | | |
|---|---|---|---|
| 0095384 | 11/1983 | European Pat. Off. | 204/298.05 |
| 269446 | 6/1988 | European Pat. Off. | |
| 950651 | 4/1949 | France . | |
| 2612098 | 9/1977 | Germany . | |
| 58-164782 | 9/1983 | Japan . | |
| 0190357 | 10/1984 | Japan | 204/298.05 |

OTHER PUBLICATIONS

IBM Technical Disclosure Bulletin vol. 26 No. 11 Apr. 1984 pp. 6154–6155.

*Primary Examiner*—Nam Nguyen
*Attorney, Agent, or Firm*—Felfe & Lynch

[57] ABSTRACT

Apparatus for coating substrates 31, 31", ... in a vacuum chamber 2 including a substrate carrier 30 disposed therein and a device 29 for generating a first plasma cloud 28 and, further, including magnets 26, 27 directing the plasma cloud 28 onto the surface of the substrates 31, 31" ... wherein this device for generating the plasma cloud 28 has an election emitter 11 and a downstream tubular anode 38, the anode has an inlet 10 for the process gas to ignite the plasma and, further, the device is provided with magnets 4, 7 for directing and guiding the plasma through the anode tube 38 into the process chamber 43 and including a device for generating atoms, molecules or clusters of the materials for producing a layer on the substrates 31, 31", ... , preferably an electron beam evaporator 37 from which the evaporated or sputtered material 33 can be directly applied onto the substrates 31, 31" . . . . A second plasma 60 is generated between the crucible 45 of the electron beam evaporator 37 and the anode tube 38 of the plasma source 29 by applying a potential difference between the plasma source 29 and the vacuum chamber 2.

19 Claims, 1 Drawing Sheet

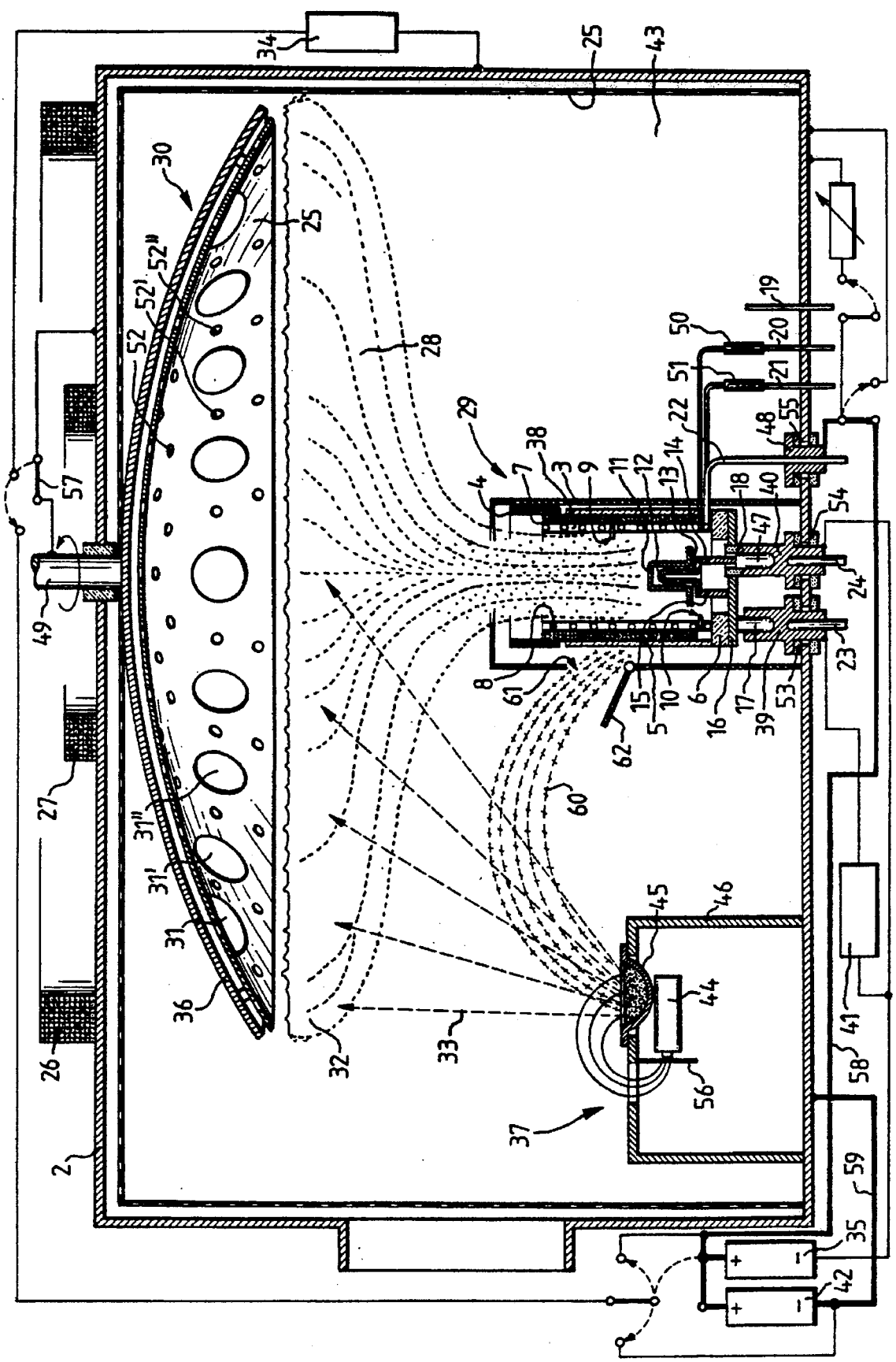

APPARATUS FOR COATING SUBSTRATES

This application is a continuation of application Ser. No. 07/648,118 filed Jan. 31, 1991, abandoned.

BACKGROUND OF THE INVENTION

The invention relates to an apparatus for coating substrates in a vacuum chamber including a substrate carrier disposed therein and a device for generating a plasma cloud and, further, including magnets directing the plasma cloud onto the surface of the substrates. The device for generating the plasma cloud has an electron emitter and a downstream tubular anode. The anode has an inlet for the process gas to ignite the plasma. Further, the device is provided with magnets for directing and guiding the plasma through the anode tube into the process chamber and including a device for generating atoms, molecules or clusters of the materials for producing a layer on the substrates. Preferably, this is an electron beam evaporator or a thermic evaporator which is disposed directly adjacent to the plasma source and opposite the substrate holder from which the evaporated or sputtered material can be directly applied onto the substrates.

Already known is a plasma generator with an ion beam generator (paper by D. M. Goebel, G. Campbell and R. W. Conn in "Journal of Nuclear Material," 121 (1984), 277–282, North Holland Physics Publishing Division, Amsterdam). This plasma generator produces ions and electrons, referred to as a plasma beam, and is disposed in a separate chamber connected to the vacuum chamber. The approximately cylindrical chamber wall of this separate chamber forms the anode and is provided with an inlet for the process gas. The cylindrical chamber has annular magnetic coils and pipes for cooling the chamber wall. The electron emitter itself is disposed at the one part of the wall which closes the cylindrical chamber and faces away from the actual vacuum chamber.

Another cathode sputtering apparatus is known (DE-OS 38 30 478) where the vacuum chamber has a device for generating a plasma beam and is provided with a target which interacts with magnets which in turn direct the plasma beam onto the surface of the target. It also includes a device for accelerating ions in the plasma beam which arrive at the surface of the target where they eject particles. The latter device has substrate holders which are disposed in the interior of the vacuum chamber to support the substrates to be coated with the sputtered particles. Preferably, the apparatus also includes a device, for example a magnet arrangement, for deflecting at least a split beam or a partial beam of the plasma beam from the target onto the substrate.

SUMMARY OF THE INVENTION

It is an object of the present invention to improve the efficiency of an apparatus for coating a metallic or dielectric material by means of an externally generated first plasma where the uniformity of the coating is particularly high and the design is simple. The plasma is generated independently of the generation of the coating material and the individual parameters can be independently adjusted. Moreover, it is possible to freely select the substrate size to be coated and the thickness of the coating can be as uniform as possible.

A device for generating atoms, molecules or clusters of the materials for producing a layer on the substrates, preferably an electron beam evaporator or a thermic evaporator, is disposed in the process chamber directly adjacent to the plasma source and opposite the substrate holder, whereby evaporated or sputtered material can be directly applied onto the substrates.

A further object of providing an additional ionization of the evaporated material and thus enhancing the layer qualities is accomplished by generating a second plasma between the crucible of the electron beam evaporator and the anode tube of the first plasma source by applying a potential difference between the plasma source and the vacuum chamber by means of a DC power source. The latter is connected to the cathode and the anode of the first plasma discharge such that the crucible acts as the cathode for the second plasma and the anode tube of the first plasma source forms the anode for the second plasma. Adjacent to the crucible, there is an opening in the dark space shield in order to provide a direct connection for the electrons of the second plasma discharge to the magnetic field shield which in turn is conductively connected to the anode tube.

BRIEF DESCRIPTION OF THE DRAWINGS

The sole FIGURE is a diagrammatic representation of the invention showing an apparatus for coating substrates.

DETAILED DESCRIPTION OF THE PREFERRED EMBODIMENT

The present invention relates to a device and a process for modifying the properties of thin layers which can either insulate or be metallic. Thin layers of this kind can be applied onto the substrate 31, 31', . . . supported by the substrate holder 30, by means of vapor depositing or sputtering in the vacuum chamber 2. The method itself comprises a plasma-supported process where the properties of the growing thin layers are modified by means of ion bombardment from a marginal layer of plasma 32.

The apparatus includes a plasma source (APS-source) 29 which serves to generate the necessary plasma 28 and to extract it from the source by means of suitable magnetic and electric fields.

After the extraction from the source 29, suitable magnetic fields direct the plasma 28 from the source 29 to the substrate carrier 30. There it is expanded and distributed as homogeneously as possible in the region of the substrate carrier 30. The ions of the plasma 28 are formed from ions of gases introduced into the plasma source 29 via lines 20, 21 and/or they are split off of the ionized vapor deposition material 33 and/or the sputtering material which traverses the plasma 28 thus being.

The substrate holder 30 is connected to a DC- or (and) a HF-power source, 35, 42 and 34, respectively, either insulated with respect to the vacuum chamber 2 or via a switch 57. This substrate holder 30 can have a vapor deposition shield 25 which, during the deposition of insulating materials, prevents a coating of a part of the surface of the substrate carrier 30 thus allowing electrical charges to be discharged via substrate carrier 30.

Moreover, the vacuum apparatus has a device for generating atoms and/or molecules or clusters of materials for producing the thin layers. In the present case, this is the electron beam evaporator 37. However, also possible is a thermic evaporator, an HF- or a DC sputtering cathode, or an ion beam sputtering cathode.

The vacuum apparatus has gas inlets 19 for the supply of reactive gases, e.g. $O_2$ and $N_2$, and further includes a system of electromagnetic coils 4, 7 and 26, 27 for guiding the plasma 28 from the plasma source 29 to the substrate holder 30 and for generating a suitable density distribution of the plasma at the substrate holder 30.

The vacuum apparatus is also equipped with a perforated inner walls 65 which act as protection from vapor deposition and allow charged particles to be discharged while the insulating material is applied.

The device further includes the plasma source (APS-source) which is referenced in its entirety as 29. This source serves to generate the plasma cloud and to modify the properties of the thin layers.

In order to generate the plasma 28, a hot glow discharge is generated in this plasma source 29. For this purpose, the plasma source has a cathode 11 which is insulated relatively to the apparatus. The cathode 11 has a heater 12, e.g. made of graphite, which is heated with alternating current. Via thermal radiation, the heater indirectly heats up the cathode 11. The cathode 11 is made of a material, for example lanthanum hexaboride $LaB_6$, which, when heated up allows electrons to be emitted. The cathode 11 itself comprises a cylindrical and lid-like part so that electrons can be emitted in radial as well as in the axial direction relative to the axis of the source 29. In the present case, this is a vertical direction.

Moreover, the plasma source 29 has an anode tube 38 insulated relatively with respect to the apparatus and to the cathode 11. This tube may have a cooling element 8 passed through by water. The electric current flows via the cooling agent pipe which is also insulated with respect to the apparatus.

The process gas itself can be a noble gas, e.g. Ar, or a reactive gas, e.g. $O_2$, or a mixture of both. Both gas supply lines 20,21 are insulated with respect to the apparatus.

Further, the plasma source 29 has two water-cooled high current passages 39, 40 and a long solenoid magnet 7 which is slid over the anode tube 38. This magnet 7 generates an axial magnetic field parallel to the perpendicular axis of the source 29.

The magnet 7 greatly reduces the mobility of the electrons in the radial direction and guides them in the axial direction. On top of the long solenoid magnet 7, there is a short solenoid 4 amplifying the magnetic field at the end of the long solenoid. The magnetic field thus becomes more homogeneous in the source since the axial magnetic field of a solenoid decreases down to half the value from its center toward its end. The apparatus described hence improves the extraction of the plasma 28 from the source 29 into the vacuum apparatus.

At the plasma source 29, a cylindrical shielding tube 5 made of a soft-magnetic material covers the long solenoid 7. This shielding tube 5 serves as a protection from stray magnetic fields which may occur inside the apparatus (e.g. caused by electron beam evaporators) so as not to interfere with the plasma inside the source 29. Moreover, the plasma source 29 is provided with a dark space shield 3 to avoid undesired secondary plasmas on the outside of the source 29.

Both the plasma source 29 and the substrate holder 30 can be connected to the power units 34, 35, 42 by means of which the functioning of the plasma source 29 and the properties of the plasma can be determined. A separate heating power unit 41 is provided for the heater 12 of the cathode 11.

Moreover, the plasma source 29 has a power supply 35 for the discharge current. It serves to determine the potential difference between the cathode 11 and the anode 38 and/or substrate holder 30 and/or vacuum chamber 2.

Finally, the plasma source 29 has a power supply 42 for applying a bias potential difference, e.g. between the plasma source 29 and the apparatus 2 or the substrate holder 30. It is thus possible to change the energy of the ions arriving at the substrates 31, 31', . . . .

The substrate holder 30 has a high frequency voltage supply 34 by means of which it is possible to supply even insulated substrates 31, 31', . . . with an additional DC-offset bias voltage relative to the plasma 28 and to thus increase energy and strength of current of the ions arriving at the substrates 31, 31', . . . .

In the represented circuitry arrangement, the source operates as a "Reflex-Arc" source. The anode tube is directly connected to the plus pole of the discharge supply 35 so that the discharge current can be discharged only via the anode tube 38. The plasma source is disposed such that it is insulated with respect to all other parts of the apparatus. The axial field of the solenoid magnets 7 prevents electrons emanating from the cathode 11 to directly reach the anode tube 38. The electrons rather follow the magnetic field lines and thus leave the source 29 to generate a plasma 28 outside the source. The entire source is therefore adjusted to a positive potential relative to the remaining parts of the apparatus. A consequence thereof is the generation of an electric field which causes the electrons to be reflected outside the source and to return to the anode tube along the field lines.

In this mode of operation, the substrate holder 30 is not charged with a negative bias potential, as is the case, for example, in an ion-plating process. Typically, the substrate holder 30 is charged to +2 V to +5 V and the ions receive their energy via the potential difference between the anode tube 38 and the substrate holder 30.

The following is an example of typical values:

| | |
|---|---|
| $P_{Ar}$ | $= 2 \times 10^{-4}$ mbar across the source |
| $P_{O2}$ | $= 4 \times 10^{-4}$ mbar across the apparatus |
| $U_{cathode-anode}$ | $= 60$ V |
| $U_{anode-apparatus}$ | $= +75$ V |
| $I_{discharge}$ | $= 45$ A |

As seen in the FIGURE, both the anode tube 38 and the hollow cylindrical magnetic field shield 5 rest on the insulator plate 6 made of ceramic, which in turn is supported on the contact plate 16 made of copper.

The heater 12 is firmly attached to the hat-like electron emitter 11 by means of a clamping ring 13. The attachment also includes two contact studs 14, 15 to support the heater 12 on the contact plate 16, on the one side, and on the contact piece 47, on the other side.

A protrusion 17 joins the contact plate 16 to the high current passage 39 which is supported at the wall of the vacuum chamber by means of insulator 53 and also has a cooling pipe 13 conducting water. A ceramic ring 18 electrically insulates the contact plate 16 with respect to the high current passage 40. The latter also has a cooling agent pipe 24 and, via protrusion 47, it conductively contacts the contact stud 14. The insulator 55 supports the high current passage at the bottom of the vacuum chamber and encloses the cooling pipe 22 which is passed through by water and connected to a DC-power unit. Pipes 20, 21 are connected to inlet 9 and 10 and both have an electrically insulating intermediate tube 50 and 51.

The evaporator 37 disposed on one side next to the plasma source 29 at the bottom of the vacuum chamber 2 includes an evaporator rack 46, a crucible 45 supported by the latter at its top and containing the coating material to be evaporated, an electron beam cannon 44 for melting and evaporating the material, and a diaphragm 56 for directing the electron radiation.

When the electron beam evaporator 37 is used for deposition, the material to be applied, which is contained in the crucible 45, is melted by means of electron bombardment. These electrons are generated with the electron beam cannon 44. When the material to be molten is exposed to this electron bombardment, secondary electrons are also generated. Using, for example, an APS-source 29 in the vicinity of this electron beam evaporator 37, the latter being at the same electrical potential as vacuum chamber, these secondary electrons can be used to generate a second plasma 60 between the crucible 45 of the electron beam evaporator 37 and the anode tube 38 of the APS-source 29. This, however, requires that a potential which is positive relative to the apparatus is applied to the APS source 29 and, hence, the anode tube 38 by means of a bias power unit 42 and via lines 58, 59. At the same time, a plasma is generated in the APS source 29 and transported into the apparatus.

For this purpose, it is necessary to provide an opening 61 in the dark space shield 3 directly opposite the electron beam evaporator 37 so that the secondary electrons emerging from the crucible 45 of the electron beam evaporator 37 directly reach the magnetic field shielding tube 5 which is at the anode potential thus generating the plasma 60.

The plasma cloud so generated above the crucible leads to an additional ionization of the material to be deposited. Consequently, the qualities of the applied thin layer are further improved as is the distribution over the substrate carrier since the ions are directed onto the substrate carrier through the plasma and the magnetic field present in the apparatus.

It is understood that the opening 61 can be omitted in a special embodiment (not represented). In this case, the plasma flow 60 enters the upper central opening in the cover of the dark space shield 3 from the crucible 45 and directly reaches the anode tube 38.

What is claimed is:

1. Apparatus for coating substrates, comprising a vacuum chamber, a substrate holder in said vacuum chamber for holding a plurality of substrates to be coated, a first plasma source for generating a first plasma in said vacuum chamber opposite said substrate holder and comprising an electron emitter, a downstream tubular anode tube having an inlet for process gas to ignite said plasma, first magnetic means for guiding the first plasma through the anode tube, said first magnetic means comprising at least one annular magnet around said anode tube, a magnetic shield surrounding said at least one annular magnet, and a dark space shield surrounding said magnetic shield and spaced therefrom, second magnetic means for directing the first plasma onto the surface of the substrates, and a vaporized material source in said vacuum chamber for evaporating the material to be deposited on said substrates, said material source being adjacent said plasma source and opposite said substrate holder, said material source evaporating said material independently of said plasma generated by said plasma source.

2. Apparatus as in claim 1 wherein said vaporized material source comprises an electron gun and a crucible containing the material from which said material is evaporated, thereby generating secondary electrons, said apparatus further comprising a first DC-power unit having a first pole and a second pole for applying a potential difference between said first plasma source and said crucible, a magnetic shield surrounding said anode tube and conductively connected to said anode tube, and a dark space shield surrounding the magnetic shield and having an opening providing a direct connection for said secondary electrons to said magnetic shield, thereby generating a second plasma between the crucible and the magnetic shield.

3. Apparatus as in claim 2 further comprising an electrically conductive cooling pipe connected to said anode means for electrically connecting said first pole of said DC-power unit to said cooling pipe, an evaporator rack on which the crucible is mounted, a means for connecting said second pole of said DC-power source to said evaporator rack.

4. Apparatus as in claim 3 further comprising a flap for closing said opening in said dark space shield.

5. Apparatus as in claim 1 wherein said substrate holder is electrically insulated from said process chamber, said apparatus further comprising a second DC-power supply unit, a high-frequency generator, means for connecting said substrate holder to at least one of said second DC-power supply unit and said high frequency generator.

6. Apparatus as in claim 1 wherein said apparatus further comprises means for rotating said substrate holder in said chamber.

7. Apparatus as in claim 1 wherein the substrate holder comprises a first shield-like sheet metal piece having a plurality of holes therein and a second shield-like sheet metal piece spaced therefrom opposite said first plasma source.

8. Apparatus as in claim 1 wherein said second magnetic means comprises at least one annular magnet disposed adjacent the substrate holder opposite said first plasma source.

9. Apparatus as in claim 1 wherein said vacuum chamber comprises an outer wall and a perforated inner wall spaced therefrom.

10. Apparatus as in claim 1 wherein said vaporized material source comprises an electron beam evaporator.

11. Apparatus for coating substrates, comprising a vacuum chamber, a substrate holder in said vacuum chamber for holding a plurality of substrates to be coated, a first plasma source for generating a first plasma in said vacuum chamber opposite said substrate holder and comprising an electron emitter, a downstream tubular anode tube having an inlet for process gas to ignite said plasma, and first magnetic means for guiding the first plasma through the anode tube, second magnetic means for directing the first plasma onto the surface of the substrates, an electron gun and a crucible for a material to be evaporated, said electron gun and said crucible being located in said vacuum chamber adjacent said first plasma source and opposite said substrate holder, said electron gun causing secondary electrons to be emitted from said material as said material is evaporated, a first DC-power unit having a first pole and a second pole for applying a potential difference between said anode tube and said crucible, a magnetic shield surrounding said anode tube and conductively connected to said anode tube, and a dark space shield surrounding the magnetic shield and having an opening providing a direct connection for said secondary electrons to said magnetic shield, thereby forming a second plasma between the crucible and the magnetic shield.

12. Apparatus as in claim 11 further comprising an electrically conducting cooling pipe connected to said anode, means for electrically connecting said first pole of said first DC-power unit to said cooling pipe, an evaporator rack on which said crucible is mounted, and means for connecting said second pole of said DC power source to said evaporator rack.

13. Apparatus as in claim 12 further comprising a flap for closing said opening in said dark space shield.

14. Apparatus as in claim 11 wherein said substrate holder is electrically insulated from said process chamber, said apparatus further comprising a second DC-power supply unit, a high frequency generator, and means for connecting said substrate holder to at least one of said second DC-power supply unit and said high frequency generator.

15. Apparatus as in claim 11 further comprising means for rotating said substrate holder in said chamber.

16. Apparatus as in claim 11 wherein the substrate holder comprises a first shield-like sheet metal piece spaced therefrom opposite said first plasma source.

17. Apparatus as in claim 11 wherein said first magnetic means comprises at least one annular magnet around said anode tube, said a magnetic shield surrounding said annular magnet.

18. Apparatus as in claim 11 wherein said second magnetic means comprises at least one annular magnet disposed adjacent the substrate holder opposite said first plasma source.

19. Apparatus for coating substrates, comprising a vacuum chamber comprising an outer wall and a perforated inner wall spaced therefrom, a substrate holder in said vacuum chamber for holding a plurality of substrates to be coated, a first plasma source for generating a first plasma in said vacuum chamber opposite said substrate holder and comprising an electron emitter, a downstream tubular anode tube having an inlet for process gas to ignite said plasma, and first magnetic means for guiding the first plasma through the anode tube, second magnetic means for directing the first plasma onto the surface of the substrates, and a vaporized material source in said vacuum chamber for evaporating the material to be deposited on said substrates, said material source being adjacent said plasma source and opposite said substrate holder, said material source evaporating said material independently of said plasma generated by said plasma source.

* * * * *

UNITED STATES PATENT AND TRADEMARK OFFICE
CERTIFICATE OF CORRECTION

PATENT NO. : 5,656,141
DATED : Aug. 12, 1997
INVENTOR(S) : Betz et al.

It is certified that error appears in the above-identified patent and that said Letters Patent is hereby corrected as shown below:

On the cover, in the Abstract, line 6, change "election" to -- electron --.
In column 2, line 42, before "vapor" delete -- ionized --.
In column 2, line 44, after "being", insert -- ionized --.
In column 2, line 67, change "walls" to -- wall --.

Signed and Sealed this

Eighth Day of May, 2001

Attest:

NICHOLAS P. GODICI

Attesting Officer     Acting Director of the United States Patent and Trademark Office